United States Patent [19]

Aichert et al.

[11] Patent Number: 4,648,347
[45] Date of Patent: Mar. 10, 1987

[54] VACUUM DEPOSITING APPARATUS

[75] Inventors: Hans Aichert, Hanau am Main; Volker Bauer; Albert Feuerstein, both of Neuberg; Horst Ranke, Alzenau, all of Fed. Rep. of Germany

[73] Assignee: Leybold-Heraeus GmbH, Cologne, Fed. Rep. of Germany

[21] Appl. No.: 738,739

[22] Filed: May 29, 1985

[30] Foreign Application Priority Data

May 30, 1984 [DE] Fed. Rep. of Germany ....... 3420245

[51] Int. Cl.⁴ .............................................. C23C 13/08
[52] U.S. Cl. ..................................... 118/720; 118/715; 118/718; 118/724; 118/726; 118/728; 118/730; 118/504
[58] Field of Search ............... 118/718, 720, 724, 726, 118/728, 730, 729, 504, 715; 427/132

[56] References Cited

U.S. PATENT DOCUMENTS

| | | | |
|---|---|---|---|
| 2,793,609 | 5/1957 | Shen et al. | 118/726 |
| 3,277,865 | 10/1966 | Smith, Jr. | 118/720 |
| 3,342,632 | 9/1967 | Bate et al. | 427/132 X |
| 3,690,635 | 9/1972 | Harker et al. | 266/34 R |
| 3,971,334 | 7/1976 | Pundsack | 118/726 X |
| 4,477,489 | 10/1984 | Yanai et al. | 427/132 |

FOREIGN PATENT DOCUMENTS

| | | |
|---|---|---|
| 2162748 | 7/1973 | Fed. Rep. of Germany. |
| 2821131 | 11/1979 | Fed. Rep. of Germany. |
| 57-155368 | 9/1982 | Japan ................................. 118/715 |
| 57-155369 | 9/1982 | Japan ................................. 118/715 |
| 413218 | 6/1974 | U.S.S.R. ............................ 118/721 |

OTHER PUBLICATIONS

U.S. patent application Ser. No. 195,559, filed Oct. 9, 1980.

Primary Examiner—Richard Bueker
Attorney, Agent, or Firm—Felfe & Lynch

[57] ABSTRACT

In vacuum depositing apparatus, especially for the manufacture of magnetic tapes, a substrate holder is disposed in the form of a cooling cylinder, and in the path of the vapor stream there is a mask for the purpose of geometrically restricting the vapor stream. In order to prevent any condensation of vaporized material in solid form, the surface of the mask facing the vapor stream is not aligned horizontally, and its lowermost edge lies within the projected surface of the crucible opening. The surface of the mask can be heated up to a temperature that is between the vaporizing temperature and the solidification temperature of the vaporized material. In an especially advantageous manner, the surface of the mask is formed by tiles of a ceramic material.

6 Claims, 4 Drawing Figures

VACUUM DEPOSITING APPARATUS

This invention relates to vacuum depositing apparatus, especially for the manufacture of magnetic tapes, having a substrate holder, a vaporizing crucible with a crucible opening, and a mask lying in the path of the vapor stream between the crucible opening and the substrate holder for the restriction of the vapor stream.

In a vacuum depositing apparatus of the kind described above, which is disclosed in U.S. Pat. No. 3,342,632, the mask is formed by a horizontal plate having a window whose edges—as seen in projection—lie outside of the crucible opening. The mask is kept substantially at room temperature by a cooling coil, so that on it a considerable part of the evaporated material condenses in solid form and is lost to the vapor depositing process.

By masks of the above-described kind, it is brought about that only certain surfaces, chiefly the substrate surfaces, are reached by the vapor stream, while other surfaces, mainly the surfaces of components of the vacuum depositing apparatus, are kept free of any undesired coating. The need for this is based on the fact that the vapor stream spreads out on its way from the vaporizing crucible to the substrate. This spreading out is encountered especially in vaporization by electron beams, because in this case the vaporized particles ascend with a relatively great angular spread from the point of impingement of the electron beam and, unless special measures are taken, they impinge also on surfaces on which this is not desired.

To the extent that vapor condensation occurs on surfaces of the apparatus which, in projection, are above the crucible opening, the additional danger exists that in the course of time a coating will grow on them which, after reaching a certain thickness, will flake off and fall into the crucible opening. Since the composition of such condensates is not necessarily the same as the material being vaporized in the crucible, an extremely undesirable contamination of the crucible content will occur in such cases.

From German publications No. AS 21 62 748 and No. OS 28 21 131 and U.S. Pat. No. 3,690,635, it is already known to prevent material vaporized by electron beams from impinging on the chamber walls by providing shields in front of these chamber walls, on which the vapor condenses in solid form. Such a method results at least in a temporary material loss, and the recovery of the material can be accomplished only by complex recycling processes.

In the production of magnetic tapes by the depositing of magnetic materials, such as a cobalt-nickel alloy, for example, on a plastic tape, such as a polyester film for example, the vaporizing crucible is usually heated by at least one electron beam. For this purpose a vaporizing crucible having a rectangular crucible opening is arranged so that its longest axis is perpendicular to the direction of movement of the tape. A high-power electron beam is aimed into the crucible opening at the material to be vaporized, and is periodically deflected transversely of the tape movement direction such that the material in the crucible is vaporized very uniformly and results in the condensation of uniform layers.

There is another aspect of the process described above: in order to obtain magnetic coatings having optimum properties, a definite geometry of the elements participating in the vapor depositing process must be assured. As it appears from the above-mentioned U.S. Pat. No. 3,342,632, the substance to be deposited must impinge upon the substrate surface only at certain angles. For reasons relating to thermal technology, the substrate, namely the plastic film, is in this case carried with its back, i.e., its side remote from the vaporizer, carried on a cooling cylinder. It is important to prevent the vapor particles in this case from striking perpendicularly against the substrate. This can be done as a rule only by masking of the kind described above, but it can result, at least temporarily, in a material loss, namely when the material being vaporized condenses on the surfaces in solid form. Here, again, the danger exists that material that collects in the course of time and is not identical to what the crucible contains will undesirably fall into the crucible opening.

The invention, therefore, is addressed to the problem of devising a vacuum depositing apparatus of the kind described above, in which the mask protects certain surface areas within the apparatus against the deposit of vapor, without subtracting any very great amount of the vaporized material from the vapor depositing process, and the danger exists that portions of this vapor deposit material will contaminate the crucible contents at uncontrollable times.

The solution of the above problem is accomplished in vacuum depositing apparatus, in accordance with the invention, by the fact that the mask has a non-horizontal surface facing the vapor stream, which surface can be heated to a temperature between the vaporization temperature and the solidification temperature of the vaporized material, and that the lowest point on this surface lies within the projection surface of the crucible opening.

In the solution of the problem in accordance with the invention, cooling of the surface is deliberately avoided, and instead provision is made for the surface in question to be able to heat up to a temperature that is within the given temperature range. If the material being vaporized is known, the limits of this temperature range can easily be determined from published tables; preferably, care is taken by constructional measures to see that the surface temperature is just barely above the solidification temperature.

In the above-described manner it is brought about that the portion of the vapor stream that strikes the said surface does condense, but in liquid, not solid, form. In conjunction with the measure of tilting the surface, i.e., not disposing it horizontally, and placing its lowermost point within the vertically projected surface of the crucible opening, it is brought about that the condensed material runs down from the surface and very quickly returns into the vaporizing crucible from which it can be returned to the vapor depositing process.

In this manner given surface areas can be protected against vapor depositing just as effectively as they would be by a mask on which the material condenses in solid form. At the same time, however, the so-called material efficiency, i.e., the ratio of the material condensed on the substrate to all of the material vaporized is substantially improved, and complex recycling for the recovery of this amount of material is unnecessary. Furthermore, accumulated material is effectively prevented from dropping into the crucible opening at undesired times.

The heating of the surface to a temperature within the given range can be accomplished by external (electrical) heating, but preferably the radiant heat from the crucible contents is used for this purpose, as well as the heating effect which occurs in electron beam heating by secondary electrons emerging from the crucible contents or reflected thereby. In this latter case it is necessary only to see to it that a certain thermal balance is maintained with respect to the surface (condensation surface) in the operation of the apparatus. As a rule, the thermal input into the said surface is given by the excess heat produced by vapor deposition (condensation, radiant heat, secondary electrons). All that is necessary then is to see to it, by controlling the thermal flux to the mask mounting elements that must necessarily be present, that the desired steady-state temperature is established.

If the measured temperature is too low for the stated purpose, it is possible by improving the resistance to heat transfer between the said surface and the necessary supporting structure to provide such that a higher steady-state temperature is established. If it is too high, the heat transfer to the supporting structure must be improved.

In an especially advantageous manner, the surface of the mask in this case consists of a ceramic material such as magnesium oxide or zirconium oxide. Such materials have a relatively low thermal conductivity, so that a correspondingly high temperature gradient can easily be established between the mask surface and its back which is joined to the supporting structure.

Again, it is especially advantageous for the mask to consist of a metal supporting structure facing away from the crucible opening and having ceramic bricks or tiles fastened to it in rows whose sides facing the crucible opening form the surface.

By dividing the surface area among a greater number of ceramic tiles the danger of producing unacceptably high tensions by rapid temperature rise is forestalled. At the same time the construction of such masks can be adapted to particular circumstances by making the individual ceramic components of different composition.

An especially advantageous, and especially a more flexible construction, of such a mask is characterized in accordance with another aspect of the invention by the fact that the metal supporting structure has a plate on whose side facing the crucible opening flanged ribs are fastened and that the ceramic tiles or bricks are inserted between the ribs.

By arranging the ceramic tiles between the ribs, and by maintaining appropriate air gaps, thermal expansion length-wise of the mask is made possible, so that unacceptable thermal tensions cannot occur.

In accordance with the invention, vacuum depositing apparatus comprises a substrate holder and a vaporization crucible having a crucible opening having a projected surface. The apparatus also comprises a mask lying in the path of a vapor stream between the crucible opening and the substrate holder from a vaporized material. The mask has a non-horizontal surface facing the vapor stream, which surface can be heated to a temperature between the vaporization temperature and the solidification temperature of the vaporized material. The lowest point of the surface of the mask lies within the projected surface of the crucible opening.

For a better understanding of the invention, together with other and further objects thereof, reference is made to the following description, taken in connection with the accompanying drawings, and its scope will be pointed out in the appended claims.

Referring now to the drawings.

Figure 1:
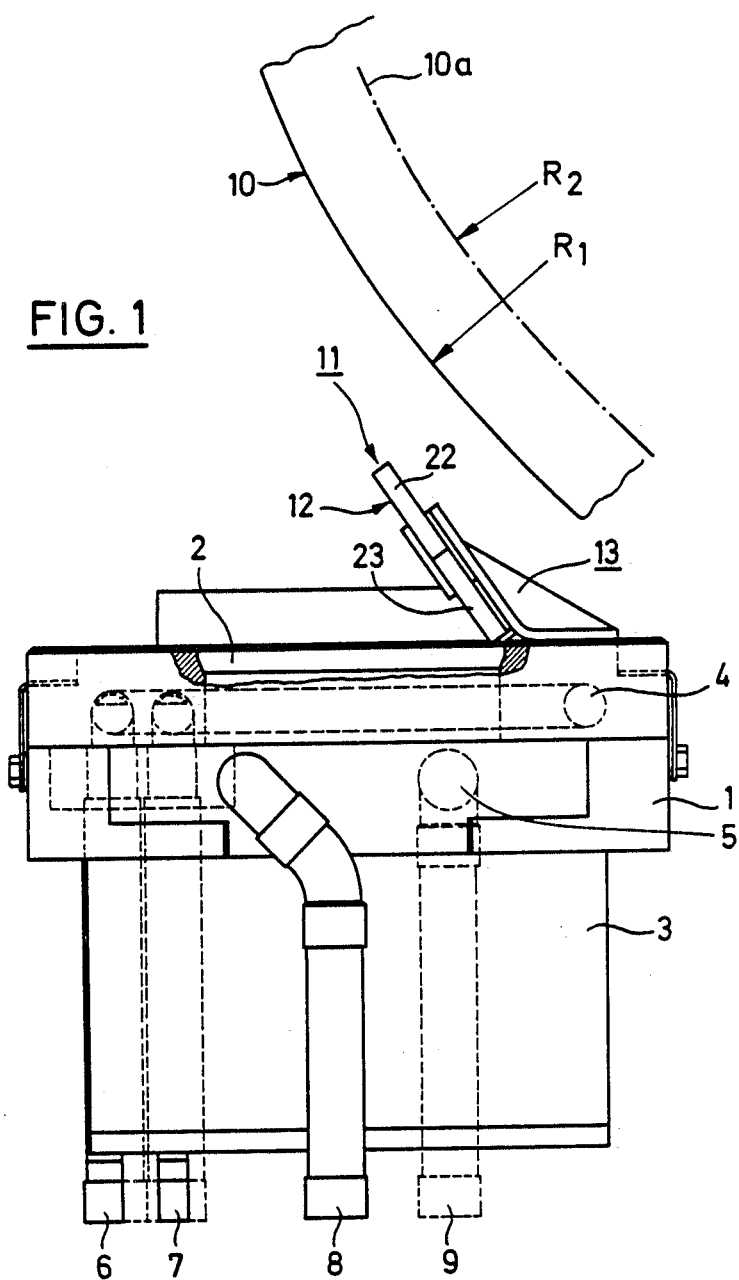
Fig. 1 is a side view of a vaporizing crucible with mask.

In FIG. 1 there is represented a vaporizing crucible 1 preferably having a rectangular crucible opening 2 whose longest axis is perpendicular to the plane of the drawing. The vaporizing crucible 1 preferably rests on a base 3 which in turn is fastened to the bottom of a vacuum chamber. The vaporizing crucible preferably is equipped with cooling passages 4 and 5 which are connected to a coolant circuit through connections 6, 7, 8 and 9.

Preferably above the crucible opening 2 and laterally offset therefrom is a substrate holder 10 which in the present case preferably is a rotatable cooling cylinder. A substrate which may be in tape form preferably is carried on this cooling cylinder and preferably comprises a plastic film. The cooling cylinder preferably has a radius R1, but a cooling cylinder having a smaller radius R2 can also be used, whose periphery 10a is indicated by a dash-dotted line. The axis of rotation of the substrate holder 10 preferably is also perpendicular to the plane of the drawing, and preferably is offset laterally above and to one side of the crucible opening 2.

A mask 11 preferably is disposed in the path of the vapor stream, between the crucible opening 2 and the substrate holder 10, and its particulars will be further explained with reference to FIGS. 2 to 4. By this mask the vapor stream arising from the crucible opening 2 is geometrically restricted and consequently strikes exclusively a circumferential portion of the substrate holder 10 which preferably is disposed at an acute angle to the vertical. Such an arrangement is preferentially suited for the production of magnetic tapes.

The mask 11 has a surface 12 facing the vapor stream, which preferably is at an angle of 50 degrees to the horizontal, i.e., it is not horizontally aligned. The lowest point on this surface 12, which is the bottom edge of the mask 11 (the bottom edge is perpendicular to the plane of the drawing) lies within the horizontal projection surface of the crucible opening 2. In this manner, any material condensing in fluid (molten) form on the surface 12 can run back into the crucible opening 2 to combine with the molten material in the crucible.

Figure 2:
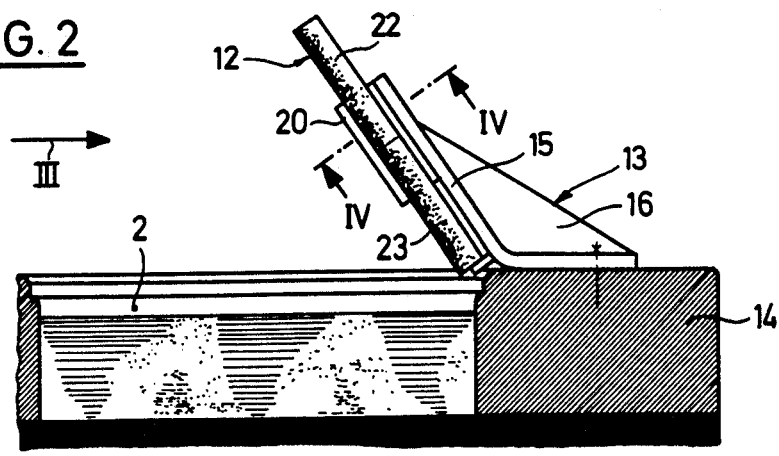
FIG. 2 is an enlarged vertical cross section taken through the mask along line II-II of FIG. 3.
Figure 3:
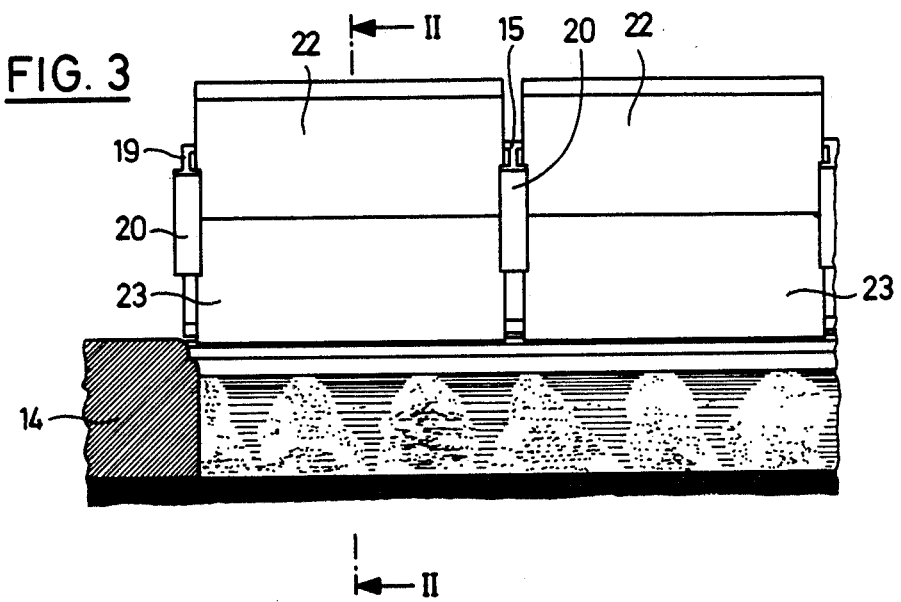
FIG. 3 is a top view of the mask, seen in the direction of the arrow III of FIG. 2.
Figure 4:
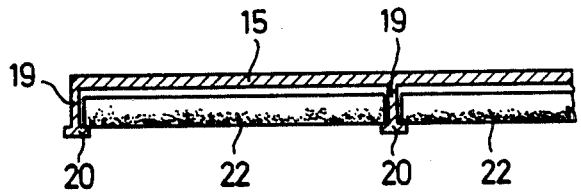
FIG. 4 is a cross section taken through the mask along line IV—IV in FIG. 2.

The following will be apparent from FIGS. 2 to 4:

The mask 11 preferably includes a metal supporting structure 13 facing away from the crucible opening 2, by which the mask is fastened on one longitudinal side of the crucible margin 14 surrounding the crucible opening 2. The metal supporting structure 13 preferably comprises a bent plate 15 of copper, which is reinforced at intervals by gussets 16.

On the side facing the crucible opening 2, the plate 1 preferably has a plurality of ribs 19 equidistantly distributed and provided with flanges 20. Between the ribs 19 ceramic tiles 22 and 23 preferably are inserted in a linear arrangement one above the other and side by side, so that, in the front view presented in FIG. 3, individual rows are created in which individually at least no perceptible air gaps are present. Between the individual rows consisting of two ceramic tiles 22 and 23 and the ribs 19 there are air gaps. The ceramic tiles 22 and 23 are prevented from falling forward and downward by the flanges 20. The air gaps permit thermal expansion in the horizontal direction.

The surfaces of all tiles 22 and 23 facing the crucible opening 2 are thus in a common plane forming the surface 12. The vapor that strikes this surface condenses thereon and runs back into the crucible opening, as can be seen especially in FIG. 2.

As soon as the apparatus is started up, i.e., as soon as the material to be vaporized is bombarded with electron beams in crucible 1, the surface 12 of the mask 11 heats up very rapidly to a temperature that is above the melting point of the material to be vaporized (in the case of a nickel-cobalt alloy this is about 1700° C.), and the steady-state temperature is sustained throughout the entire vapor depositing process. The ceramic material of the surface 12 prevents the formation of alloys, which would be entirely possible when metallic materials are used in the vaporization of a cobalt-nickel alloy.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Vacuum depositing apparatus comprising:
   a substrate holder;
   a vaporization crucible having a crucible opening having a projected surface; and
   a mask lying in the path of a vapor stream, from a vaporized material, between said crucible opening and said substrate holder, said mask having a non-horizontal surface facing the vapor stream, said non-horizontal surface being heated to a temperature between the vaporization temperature and the solidification temperature of the vaporized material, and the lowest point of said surface of said mask lying within said projected surface of said crucible opening, said mask comprising a metal supporting structure having two sides, one side facing away from said crucible opening and an other side facing toward said crucible opening and a row arrangement of ceramic building blocks mounted on said other side of said supporting structure, said blocks having sides facing said crucible opening and forming said surface of said mask.

2. Vacuum depositing apparatus in accordance with claim 1, in which said surface of said mask comprises a material selected from the group consisting of magnesium oxide and zirconium oxide.

3. Vacuum depositing apparatus in accordance with claim 1, in which said metal supporting structure has a plate having two sides, one side facing away from said crucible opening and another side facing said crucible opening with ribs with flanges in which said ceramic building blocks are disposed between said ribs.

4. Vacuum depositing apparatus in accordance with claim 3, in which said ribs have principal planes lying in vertical planes.

5. Vacuum depositing apparatus in accordance with claim 1, in which said crucible opening is rectangular and has a longest axis, and in which said mask has a longest axis aligned parallel to said longest axis of said crucible opening.

6. Vacuum depositing apparatus in accordance with claim 5, in which said substrate holder is a rotatable cooling cylinder having a surface sector adjacent to said crucible opening and having an axis of rotation parallel to said longest axis of said crucible opening, but is disposed above and laterally offset from said longest axis of said crucible opening, such that, between said surface sector of said cooling cylinder adjacent to said crucible opening and a horizontal plane running through said crucible opening, an approximately wedge-shaped gap is present, and said mask being disposed in said wedge-shaped gap.

* * * * *